United States Patent
Elliott et al.

(10) Patent No.: US 7,270,724 B2
(45) Date of Patent: Sep. 18, 2007

(54) SCANNING PLASMA REACTOR

(75) Inventors: David J. Elliott, Wayland, MA (US); Kenneth J. Harte, Carlisle, MA (US); Larry E. Shephard, Shirley, MA (US)

(73) Assignee: UVTech Systems, Inc., Wayland, MA (US)

(*) Notice: Subject to any disclaimer, the term of this patent is extended or adjusted under 35 U.S.C. 154(b) by 0 days.

(21) Appl. No.: 09/736,073

(22) Filed: Dec. 13, 2000

(65) Prior Publication Data

US 2002/0069966 A1    Jun. 13, 2002

(51) Int. Cl.
*H01L 21/00* (2006.01)
*C23C 16/00* (2006.01)

(52) U.S. Cl. ............. 156/345.5; 118/50.1; 118/722

(58) Field of Classification Search ......... 156/345.5, 156/345.38; 118/723 R, 723 MP, 722; 164/496; 250/504 R See application file for complete search history.

(56) References Cited

U.S. PATENT DOCUMENTS

| | | | |
|---|---|---|---|
| 4,059,461 A | 11/1977 | Fan et al. | 148/1.5 |
| 4,264,330 A * | 4/1981 | Schmidt et al. | 252/301.21 |
| 4,296,146 A | 10/1981 | Penn | 427/58 |
| 4,309,225 A | 1/1982 | Fan et al. | 148/1.5 |
| 4,323,417 A | 4/1982 | Lam | 156/613 |
| 4,381,965 A | 5/1983 | Maher, Jr. et al. | 156/345 |
| 4,400,715 A | 8/1983 | Barbee et al. | 357/49 |
| 4,439,245 A | 3/1984 | Wu | 148/1.5 |
| D275,032 S | 8/1984 | Maher, Jr. et al. | D24/1.1 |
| 4,473,435 A | 9/1984 | Zafiropoulo et al. | 156/643 |
| 4,539,062 A | 9/1985 | Zajac | 156/345 |
| 4,549,064 A | 10/1985 | Delfino | 219/121 |
| 4,589,951 A | 5/1986 | Kawamura | 156/617 |
| 4,639,277 A | 1/1987 | Hawkins | 148/33.3 |
| 4,655,849 A | 4/1987 | Schachameyer et al. | 148/1.5 |
| 4,659,401 A | 4/1987 | Reif et al. | 148/175 |
| 4,679,308 A | 7/1987 | Finn et al. | 29/576 |
| 4,685,976 A | 8/1987 | Schachameyer et al. | 437/173 |
| 4,721,282 A | 1/1988 | Shawver et al. | 251/62 |
| 4,724,219 A | 2/1988 | Ridinger | 437/19 |
| 4,737,233 A | 4/1988 | Kagmar et al. | 456/620.73 |
| 4,861,732 A | 8/1989 | Fujimura et al. | 437/229 |

(Continued)

FOREIGN PATENT DOCUMENTS

JP    62047482 A * 3/1987

(Continued)

OTHER PUBLICATIONS

Elliott et al., "Deep UV-Photoreactive Cleaning with Catadioptric Projection Optics and Reactive Gases", Future Fab International, pp. 273-276, 279-282, date unknown.

*Primary Examiner*—Parviz Hassanzadeh
*Assistant Examiner*—Michelle Crowell
(74) *Attorney, Agent, or Firm*—Iandiorio & Teska

(57) ABSTRACT

A scanning plasma reactor for exciting reactant gases at a substrate surface including a beam forming module, a gas injection module, a reaction chamber with a window and a vacuum chuck, a gas exhaust module. Radiation from the beam forming module and the reactant gas create an excited plasma zone. The excited plasma zone is translated across the substrate like a windshield wiper blade, or the substrate is conveyed under a fixed gas reaction zone.

30 Claims, 10 Drawing Sheets

U.S. PATENT DOCUMENTS

| | | | |
|---|---|---|---|
| 4,889,588 A | 12/1989 | Fior .......................... 156/643 |
| 4,938,839 A | 7/1990 | Fujimura et al. ........... 156/628 |
| 4,949,670 A | 8/1990 | Krogh ........................ 118/723 |
| 4,976,996 A | 12/1990 | Monkowski et al. .... 427/255.5 |
| 5,002,631 A * | 3/1991 | Giapis et al. ............... 156/643 |
| 5,091,339 A | 2/1992 | Carey ........................ 437/187 |
| 5,171,415 A | 12/1992 | Miller et al. ........... 204/298.09 |
| 5,174,826 A * | 12/1992 | Mannava et al. ........... 118/719 |
| 5,188,717 A | 2/1993 | Broadbent et al. ..... 204/192.12 |
| 5,204,517 A * | 4/1993 | Cates et al. .................... 134/1 |
| 5,219,786 A | 6/1993 | Noguchi ..................... 437/174 |
| 5,228,206 A | 7/1993 | Grant et al. ...................... 34/1 |
| 5,234,526 A | 8/1993 | Chen et al. ................. 156/643 |
| 5,234,540 A | 8/1993 | Grant et al. ................ 156/646 |
| 5,238,499 A | 8/1993 | van de Ven et al. ........ 118/724 |
| 5,264,383 A | 11/1993 | Young ......................... 437/40 |
| 5,298,112 A | 3/1994 | Hayasaka et al. ........... 156/643 |
| 5,346,586 A | 9/1994 | Keller ........................ 156/656 |
| 5,346,850 A | 9/1994 | Kaschmitter et al. ......... 437/81 |
| 5,391,517 A | 2/1995 | Gelatos et al. ............... 437/190 |
| 5,393,374 A | 2/1995 | Sato et al. ................... 156/643 |
| 5,393,482 A | 2/1995 | Benda et al. ................... 419/1 |
| 5,403,436 A | 4/1995 | Fujimura et al. ........... 156/643 |
| 5,458,724 A | 10/1995 | Syverson et al. ........... 156/345 |
| 5,488,229 A * | 1/1996 | Elliott et al. .............. 250/492.2 |
| 5,529,951 A | 6/1996 | Noguchi et al. ............. 437/174 |
| 5,534,107 A | 7/1996 | Gray et al. ............... 156/643.1 |
| 5,534,231 A | 7/1996 | Savas ......................... 216/67 |
| 5,559,338 A * | 9/1996 | Elliott et al. ............. 250/492.1 |
| 5,580,421 A | 12/1996 | Hiatt et al. ............... 150/643.1 |
| 5,605,599 A | 2/1997 | Benzing et al. .......... 156/643.1 |
| 5,614,026 A | 3/1997 | Williams .................... 118/723 |
| 5,618,752 A | 4/1997 | Gaul .......................... 438/626 |
| 5,647,953 A | 7/1997 | Williams et al. ......... 156/643.1 |
| 5,655,312 A | 8/1997 | Sevcik |
| 5,662,143 A | 9/1997 | Caughran ................... 137/884 |
| 5,669,979 A | 9/1997 | Elliott et al. .................... 134/1 |
| 5,679,215 A | 10/1997 | Barnes et al. ............ 156/646.1 |
| 5,722,877 A | 3/1998 | Meyer et al. ................. 451/41 |
| 5,762,755 A | 6/1998 | McNeilly et al. ......... 156/652.1 |
| 5,814,154 A | 9/1998 | Boitnott ..................... 118/723 |
| 5,814,156 A | 9/1998 | Elliott et al. .................... 134/1 |
| 5,824,604 A | 10/1998 | Bar-Gadda ................. 438/725 |
| 5,830,277 A | 11/1998 | Johnsgard et al. ........... 118/725 |
| 5,841,623 A | 11/1998 | Denison et al. ............. 361/234 |
| 5,846,443 A | 12/1998 | Abraham ..................... 216/77 |
| 5,855,675 A | 1/1999 | Doering et al. ............. 118/719 |
| 5,863,170 A | 1/1999 | Boitnott et al. ............. 414/222 |
| 5,863,376 A | 1/1999 | Wicker et al. .............. 156/345 |
| 5,882,414 A * | 3/1999 | Fong et al. ............. 118/723 R |
| 5,891,513 A | 4/1999 | Dubin et al. ................... 427/98 |
| 5,895,272 A | 4/1999 | Li ............................... 438/705 |
| 5,913,147 A | 6/1999 | Dubin et al. ................ 438/687 |
| 5,914,278 A | 6/1999 | Boitnott et al. ............. 438/724 |
| 5,922,219 A | 7/1999 | Fayfield et al. ............... 216/58 |
| 5,928,426 A | 7/1999 | Aitchison ................... 438/715 |
| 5,930,669 A | 7/1999 | Uzoh ......................... 438/627 |
| 5,948,283 A | 9/1999 | Grosshart ..................... 216/67 |
| 5,964,949 A | 10/1999 | Savas ......................... 118/723 |
| 5,968,279 A | 10/1999 | MacLeish et al. ........... 134/1.2 |
| 5,969,422 A | 10/1999 | Ting et al. .................. 257/762 |
| 5,983,828 A | 11/1999 | Savas ......................... 118/723 |
| 5,984,391 A | 11/1999 | Vanderpot et al. ........... 294/1.1 |
| 5,985,089 A | 11/1999 | Leibovich et al. ........... 156/345 |
| 5,988,187 A | 11/1999 | Trussell et al. ............. 134/22.1 |
| 5,989,623 A | 11/1999 | Chen et al. ................... 427/97 |
| 5,990,008 A | 11/1999 | Koyama et al. ............. 438/687 |
| 5,996,528 A | 12/1999 | Berrian et al. .............. 118/723 |
| 6,006,694 A | 12/1999 | DeOrnellas et al. ........ 118/723 |
| 6,008,117 A | 12/1999 | Hong et al. |
| 6,013,155 A | 1/2000 | McMillin et al. ........... 156/345 |
| 6,015,503 A | 1/2000 | Butterbaugh et al. ......... 216/66 |
| 6,022,416 A | 2/2000 | Olson ........................ 118/726 |
| 6,024,887 A | 2/2000 | Kuo et al. .................... 216/48 |
| 6,027,603 A | 2/2000 | Holland et al. ............. 156/345 |
| 6,035,868 A | 3/2000 | Kennedy et al. ............. 134/1.1 |
| 6,037,258 A | 3/2000 | Liu et al. .................... 438/687 |
| 6,038,358 A * | 3/2000 | Nishiki ........................ 385/37 |
| 6,042,687 A | 3/2000 | Singh et al. ................. 156/345 |
| 6,042,901 A | 3/2000 | Denison et al. ............. 427/579 |
| 6,048,435 A | 4/2000 | DeOrnellas et al. ........ 156/345 |
| 6,052,176 A | 4/2000 | Ni et al. ........................ 356/72 |
| 6,054,206 A | 4/2000 | Mountsier ................. 428/312.8 |
| 6,090,458 A * | 7/2000 | Murakami ................... 427/586 |
| 6,103,624 A | 8/2000 | Nogami et al. ............. 438/687 |
| 6,136,096 A * | 10/2000 | Morishige ................... 118/720 |
| 6,190,458 B1 * | 2/2001 | Harada ....................... 118/715 |
| 6,374,770 B1 * | 4/2002 | Lee et al. ................ 118/723 E |

FOREIGN PATENT DOCUMENTS

| JP | 63153277 A * | 6/1988 |
| JP | 05082480 A * | 4/1993 |
| JP | 07111246 A * | 4/1995 |

* cited by examiner

SCANNING PLASMA REACTOR

FIELD OF THE INVENTION

This invention relates to a UV-reactive gas plasma processing apparatus and method for film deposition, etching, doping, UV curing, melting, and other surface processing of a substrate(s), such as a wafer used in integrated circuit (IC) manufacturing.

BACKROUND OF THE INVENTION

The manufacturing of semiconductor devices and other small geometry electronic and optical devices, such as thin film heads, printed circuit boards, and compact discs, involves many surface processing operations. Examples of these surface processes include the following: deposition of a metal or dielectric layer onto a surface by energetic decomposition of an excited volume of gas; etching or removal of material from a surface in an excited gas plasma atmosphere; UV polymerization of a coating; crystallization or re-crystallization of a surface by exposure of the surface to a high temperature in an excited gas atmosphere; photochemical treatment of a surface to improve adhesion of a subsequent layer; melting of a surface to fuse or alloy another material into its structure; energetic photochemical surface treatment to implant impurity ions into a surface structure of applied doped layers; oxidation or oxide growth to create a thin dielectric layer; or producing a reduction reaction on a surface to remove an oxide or other layer.

Typically, in prior art reactors, the surface processes previously mentioned are performed in reaction chambers where high energy and gas mixtures are combined to produce a reaction. Many of these processes require a deep vacuum and elevated chamber temperatures. In semiconductor production manufacturing lines worldwide, these chamber-bound, surface treatment process steps (deposition, oxidation, etching, cleaning, photoreactions) constitute the majority of all IC manufacturing process steps.

A fundamental problem with prior art reactors is that the interior volume is filled with gas and energy to drive the reaction, when only the wafer surface needs reacting. Therefore, the amount of gas and energy expended into the volume of a reactor greatly exceeds the amount needed to react a thin (sub-micron) layer at the wafer surface. This large volume of gas and the energy required to excite the large volume of gas is wasteful. This causes unwanted reactions on many surfaces in addition to the substrate being processed.

There are six primary problems associated with prior art reaction chambers. The first problem associated with prior art reaction chambers relates to the deposition of reaction products onto the reaction chamber surfaces. During processing, gas reaction by-products form particles and residues on the chamber walls which, during subsequent processing, re-deposit onto the wafer, causing serious contamination and chip rejects. One method to remove this contamination is to clean the chamber with nitrogen trifluoride ($NF_3$), an expensive toxic gas; the cleaning procedure causes system downtime and reduces productivity. Several methods have been tried to reduce the contamination, such as the use of deflecting shields, containment devices, and a host of variable geometry inserts which re-direct the reactive species in an attempt to minimize the formation of these harmful by-product deposits.

The second problem associated with prior art reaction chambers relates to non-uniformity of the reactions taking place at the wafer surface. A typical reaction chamber produces an energy field which is non-uniform, and also generates a gas distribution which is non-uniform. The interactions of the energy and reactive gases are therefore non-uniform. A wide variety of specially shaped electrodes (for delivering energy) and showerheads (for delivering gases) have been utilized to improve the uniformity of the reactions at the wafer surface. The result of reaction non-uniformity is variations in the thickness of deposited films, or non-uniform removal in etch reactions, or other deviations that impact the quality and yield of IC devices in manufacturing lines.

The third problem associated with prior art reaction chambers relates to their cost efficiency, measured in terms of gas consumption and wafer-per-hour productivity. The typical reactor requires that the volume of the chamber be pumped down to a vacuum, then filled with gases. The energized gas reaction products then interact with the wafer and surrounding chamber surfaces. Since the activating energy and gas volume are not confined or specifically directed to the wafer surface, excess energy and gas is consumed, and excess process time is required to deposit or etch a film layer. High cost of operation results from excess gas and energy consumption, and lower throughput or productivity results from excess process time.

The fourth problem relates to the use of vacuum environments in prior art reactors. Wafer processing, especially in deposition and etching processes, presently requires the use of deep vacuum. First, the time required to pull a vacuum and return to atmosphere causes productivity loss, since it represents a major portion of total process time. Secondly, the equipment (big pumps, load locks, plumbing) required to provide vacuum environments is expensive and complex, thereby reducing both cost efficiency and reliability of the system. Thirdly, the system size and footprint are increased to support deep vacuum processing, and space in IC fabrication clean rooms is extremely expensive.

The fifth problem relates to the use of many types of reactors to perform a variety of wafer surface processes, and the fact that they are not fully integrated. There are many different systems used in IC manufacturing for etching, deposition, doping or ion implantation, annealing, UV curing, and surface conditioning, many of which are dedicated to a single process step. This creates large capital expenses, as well as excess wafer handling from tool to tool; handling adds contamination to the wafer and lowers chip yield.

The sixth problem relates to the high thermal environment inside prior art reactors. Wafers are subjected to high temperatures (800-1100° C.) in many reactors, which induce thermal stress, wafer warp, crystal plane slippage, dopant depth changes, and other undesirable effects. Thermal processing also reduces throughput, since gradual heat-up and cool-down cycles are used to reduce stresses, thereby reducing wafer throughput.

SUMMARY OF THE INVENTION

It is therefore an object of this invention to provide a new and improved plasma reactor apparatus and method for semiconductor wafer and other substrate manufacturing processes.

It is a further object of this invention to provide such a plasma reactor which reduces or eliminates the problems of wafer and chamber contamination caused by the deposition of reaction by-products on the interior surfaces of the reactor vessel.

It is a further object of this invention to provide such a plasma reactor which provides a small, uniform and controllable zone of reaction products at the wafer or other substrate surface.

It is a further object of this invention to provide such a reactor with reduced system operating cost by delivering the reactive gas species and excitation energy directly at the wafer surface, and not to the chamber volume.

It is a further object of this invention to provide such a plasma reactor which operates at or near atmospheric pressure, eliminating the need for deep vacuum.

It is a further object of this invention to provide such a plasma reactor which can provide a wide variety of gas chemistries and excitation energy levels to allow for many different types of surface processes within a single reactor. The object is to provide a processing environment for simultaneous and sequential wafer treatment for etching, deposition, doping or ion implantation, re-crystallization, UV curing, oxidation, surface roughening, photochemical modification, reduction reactions and other surface processes used to make IC chips.

It is a further object of this invention to provide such a reactor which does not require heating the entire mass of the chamber or even the wafer substrate holder (vacuum chuck) in order to elevate the wafer to high temperatures, thereby eliminating wafer thermal stresses and loss of productivity from warm-up and cool-down cycles.

This invention results from the realization that both the gas products and the excitation energy can be delivered directly to the surface of the wafer in a productive, controlled, uniform and efficient manner. For a given raw energy input, the effective fluence at the surface of the wafer may be changed by a factor or 4 or greater by changing the area of the beam at the surface of the wafer.

Because reaction products and energy are reacted and localized at the wafer surface, by-product contamination in the chamber is greatly reduced. Also, the UV radiation and gas is closely controlled in a small, blade-shaped reaction zone at or near the wafer surface which produces a high degree of reaction uniformity and process efficiency (wafer throughput and gas usage). The process can operate at or near atmospheric pressure, reducing cycle time and equipment cost and increasing system reliability.

Since many UV wavelengths and energy intensities can be used, along with many gas types in the same system, a high degree of process integration is possible, and fewer individual reactors are required for a given manufacturing process.

Since short wavelength UV radiation produces extremely high surface temperatures and reaction rates, the need to have high bulk temperature thermal processing is greatly reduced or eliminated.

This invention features a scanning plasma reactor with a reaction chamber and beam forming module which transforms a UV radiation source raw output into a rectangular beam. The rectangular beam is projected through a window in the reaction chamber. A substrate to be processed is held in place by a vacuum chuck. A gas injection module delivers at least one reactant gas to the substrate surface in close proximity to the rectangular beam. A gas exhaust module removes reaction by-products and unreacted reactant gas from the substrate surface. The rectangular beam and the gas injection module are moveable relative to the substrate surface.

The UV radiation source may operate at a wavelength between 351 nm and 157 nm. The rectangular beam may have dimension of about 200-300 mm in length and 0.1-10 mm in width. The rectangular beam may have an energy level at the substrate surface of about 0.1-10 Joules/cm$^2$.

The beam forming module may include a plurality of optical elements, of which at least two of the optical elements may be cylindrical refractive elements.

The scanning plasma reactor may provide a number of different reactions, including etching, deposition, oxidation, reduction, melting, surface modification, polymerization, UV curing, and doping reactions.

The exhaust module may comprise a block shaped manifold at one end of the reaction chamber to draw gas across the width of the chamber. The gas injection module and exhaust module may include adjustable slits with maximum length greater than the width of the substrate. The rectangular beam, gas injection module and exhaust module may be translated across a stationary substrate or the substrate may be moved relative to a fixed rectangular beam, gas injection module and exhaust module. The gas injection and exhaust modules may be combined into a gas injection/exhaust system.

The rectangular beam may be focused above the substrate surface to allow interaction with the reactant gas but prevent direct contact the beam and the substrate surface. The beam forming module may include an adjustable mirror which may be repositioned to change the angle of the rectangular beam relative to the substrate surface.

The window in the reaction chamber may be located on a top surface of the chamber or it may be located on a side surface of the chamber.

The scanning plasma reactor may be operated at or near atmospheric pressure.

The scanning plasma reactor may further comprise an electronic control module to programmably select a reactant gas chemistry and an excitation energy level for one or more processes, including etching, deposition, doping, ion implantation, re-crystallization, UV curing, oxidation, surface roughening, photochemical modification, and reduction reactions.

The top surface of the substrate may be transparent to the rectangular beam such that the rectangular beam causes a reaction at a layer of the substrate below the surface.

The vacuum chuck may include a heating element to heat the substrate.

This invention also features a scanning plasma reactor including a beam forming module, a reaction chamber with a window through which the beam forming module projects a rectangular beam, a gas injection module fixed at one end of the chamber and an exhaust module fixed at the opposite end of the chamber. The rectangular beam is moveable relative to the substrate surface.

This invention also features a scanning plasma reactor including a beam forming module, a reaction chamber with a window through which the beam forming module projects a rectangular beam, a gas injection module fixed to deliver at least one reactant gas and at least a second fluid or vapor to the substrate surface and an exhaust module. The rectangular beam and the reactant gas form a reaction zone which is moveable relative to the substrate surface.

This invention also features a scanning plasma reactor including a first beam forming module to form a first rectangular beam, a second beam forming module to for a second rectangular beam, a gas injection module to deliver at least one reactant gas to the substrate surface, a reaction chamber with at least one window through which the first and second rectangular beams are projected, and a gas exhaust module to remove reaction by-products and unreacted reactant gas from the substrate surface. The first and second rectangular beams and the reactant gas form a reaction zone which is moveable relative to the substrate surface. The first rectangular beam may include a UV radiation, and the second rectangular beam may include an infrared radiation. The reaction chamber may include a first window in the top of the chamber through which the first rectangular beam is projected and a second window in the side of the chamber through which the second rectangular beam is projected.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
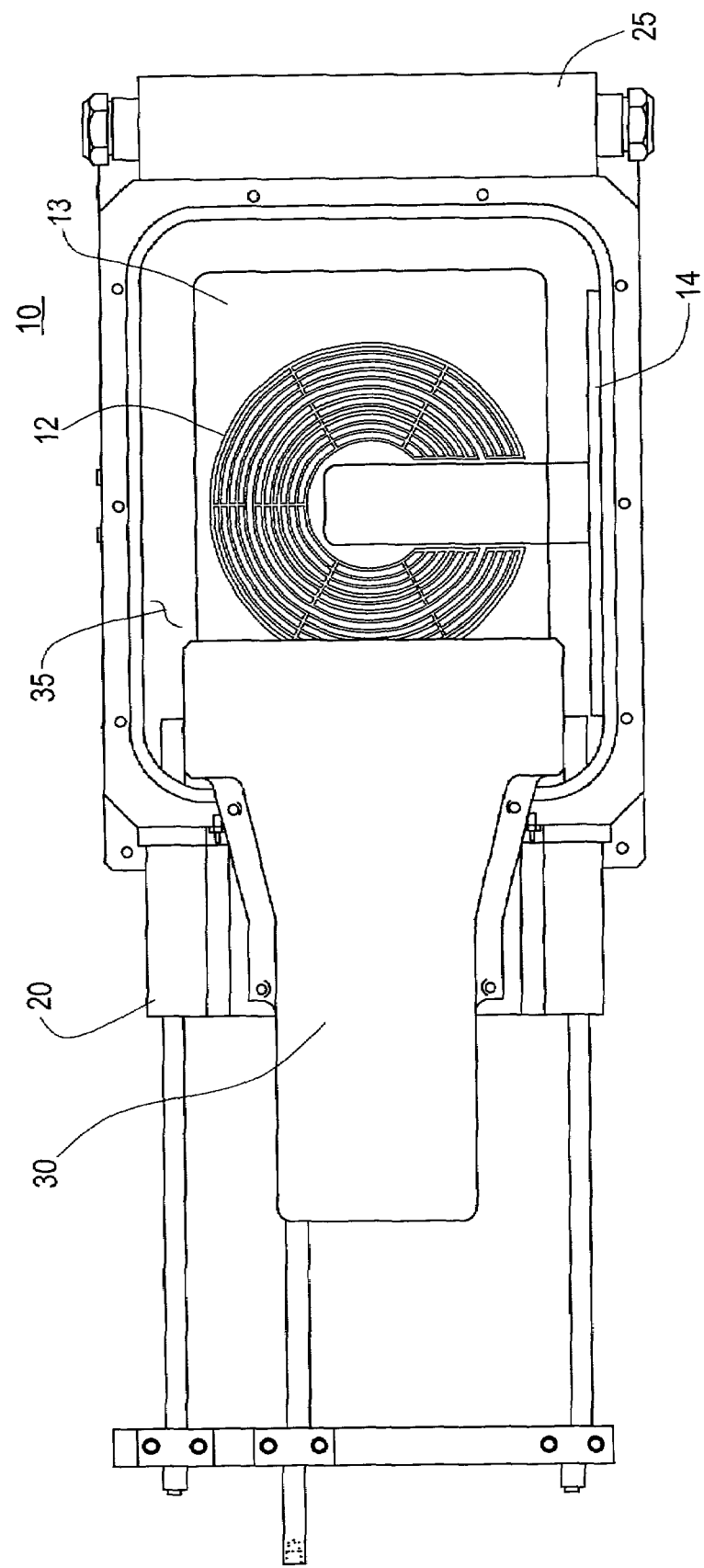
FIG. 1 is a top view of the scanning plasma reactor of the subject invention.

Scanning plasma reactor 10 is described with reference to FIGS. 1 and 2. Semiconductor wafer 11 is loaded from a cassette (not shown) and placed by a robot arm (not shown) onto vacuum chuck 12 inside reactor chamber 13 through opening 14 in the chamber sidewall. The process gases are then injected by the gas delivery/exhaust nozzle assembly 20. Process gas flows through the delivery pipe 21 into the manifold 22 and exits through the delivery nozzle 23 and is delivered onto the surface of wafer 11. Exhaust nozzle 24 removes reaction by-products as does exhaust block 25.

The beam forming module 30, containing the beam shaping optics 31, 32 and a mirror 33, receives a raw laser beam 34 and transforms it into a blade-shaped beam which is projected off of mirror 33 through window 35 into the reactor chamber 13 and is focused onto the surface of wafer 11. The incoming raw laser beam is a conventional rectangular cross-sectional beam 34, and the shaping lenses 31 and 32 are cylindrical refractive elements made from high purity fused silica. The mirror 33 which reflects the shaped beam into the chamber 13 can be angle adjusted by a simple pinned rotating assembly 36 permitting various UV laser beam incident angles delivered onto the surface of wafer 11.

Beam forming optical elements 31 and 32 are interchangeable with elements of different radii to permit a simple and quick means to change the width of the blade-shaped beam which is focused onto the surface of wafer 11.

The laser source may be an excimer laser (for example a Lambda Physik LPX 200 available from Lambda Physik in Fort Lauderdale, Fla., USA) which generates a pulsed beam 34 at wavelengths of 351 nm, 308 nm, 248 nm, 193 nm, or 157 nm. Solid state lasers could also be used (for example a 266 nm wavelength frequency quadrupled YAG laser available from Spectra Physics in Mountain View, Calif.). High intensity lamps may also be used, such a high pressure (~230 atmospheres) mercury lamps with metal additives to enhance the output in the ultraviolet portion of the electromagnetic spectrum, or other high intensity lamps with high intensity ultraviolet wavelength output.

The reaction chamber contains vacuum chuck 12 which may include a heating element 17 to increase reaction rates, such as for film deposition, etching, melting or other modification. The controlled atmosphere of reactive gas is provided within a closed reaction chamber 13 which is sufficiently sealed to hold sub-ambient pressure in the ~700-450 torr range. A stream of reactive gas is injected through injector nozzle 23. Chamber pressure is maintained by balancing the rate and amount of gas injected into the chamber with the amount of gas withdrawn through exhaust nozzle 24 and exhaust port 25.

The gas delivery/exhaust nozzle module 20 and the beam forming module 30 are both connected to a single linear translation stage that is electrically driven to translate both assemblies across the wafer surface from one end of the chamber to the other. The beam forming module 30 is positioned with respect to gas delivery/exhaust nozzle module 20 so that both the gas stream 26 and the focused UV bladed radiation 37 meet at the wafer surface, forming a gas reaction zone 15.

A scanning plasma reactor for film deposition, etching, doping, ion implantation, melting, re-crystallization, deep UV curing and other surface modifications which operates in the following way.

A recipe is established for the particular type of process to be performed. Recipe set up is performed by logging the main process settings into the system computer, including the UV energy level, laser wavelength, laser reprate, gas mixture, gas flow rates, stage scan rate, and substrate type. A specific example could be etching polysilicon on silicon dioxide, where 193 nm wavelength excimer laser pulses photolyze carbonyl di-fluoride into fluorine atoms, and would be set up by setting the gas mixture as 250 Torr of carbonyl difluoride/500 Torr helium, and the UV laser energy at ~90 mJ/cm2 surface fluence, substrate temperature is 70° C., and the scan rate at 5 mm/second. The equation for this etch reaction is:

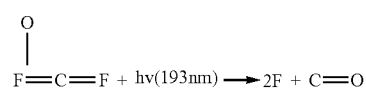

In operation, the scanning plasma reactor starts a process cycle when the system robot loads the wafer into the chamber, and the chamber door closes; the controller automatically turns on the laser source, the various control valves to manage gas flow, and the linear stage which begins the scanning of the beam forming module across the chamber window with simultaneous scanning of the gas injection/ exhaust nozzle through the chamber. Mechanical pumps control the vacuum to hold the wafer on the vacuum chuck, and also to provide additional draw from the exhaust block on the far end of the chamber to manage chamber pressure.

As soon as the beam forming module and UV blade and gas delivery system finish scanning the length of the chamber, the gas and UV radiation are automatically stopped, the beam forming and gas injection/exhaust nozzle automatically retracts to the starting position, the chamber is automatically purged of gas, the door opened, the processed wafer is removed, and the door closed. This completes the cycle for a single substrate. Additional cycles may be repeated for multiple substrates, or other recipes may be activated for different process conditions.

In addition, the software of the scanning plasma reactor allows the operator to program a wide variety of gas recipes and UV energy values for a wide range of surface applications. This allows the scanning reactor to perform the function of several individual prior art tools, saving the problem of having to transfer wafers from one tool to another and incur the associated handling defects.

The scanning plasma reactor is capable of delivering a wide range of UV energy densities, permitting a wide variety of semiconductor applications to be performed. The ability of UV photons to photochemically dissociate a large number of molecules, from a variety of gases, results in many applications being available for the scanning plasma reactor, which may deliver UV light at high (5-6+ eV) photon energies and wafer plane fluences (from as low as about 2 mJ/cm$^2$ to greater than 1000 mJ/cm$^2$) using conventional 248 nm and 193 nm commercially available excimer lasers. These energy densities will drive most standard reactions need to deposit, dope, etch, condition and surface-modify metal or nonmetallic semiconductor layers. The effects of these UV laser pulses is transient, localized heating which accelerates reactions with gases as well as liquids. The UV energy rapidly photo-dissociates molecules into volatile or more readily reacted products.

Further, UV energy at these wavelengths and below, such as the 157 nm wavelength of a fluorine excimer laser, are very strongly absorbed by complex organics to a typical absorption depth of about 200 nm, making the scanning plasma reactor useful for reaction with, and volatilization of, organically based films.

The typical UV blade according to the present invention has a dimension of about 200 mm across one axis and about 0.5 mm on the other axis, for an area of about 1 cm$^2$. In this area, using a mid-range output, commercially available Lambda Physik laser, a UV intensity of about 30 mJ/cm$^2$ can be achieved with an input pulse of about 300 mJ. Substituting a larger UV laser from Lambda Physik, with a pulse energy of about 600 mJ, the fluence in the UV blade will be about 60 mJ/cm$^2$. This level of energy is sufficient to drive most of the etching, deposition, UV curing and other surface conditioning/modification reactions.

Figure 2:
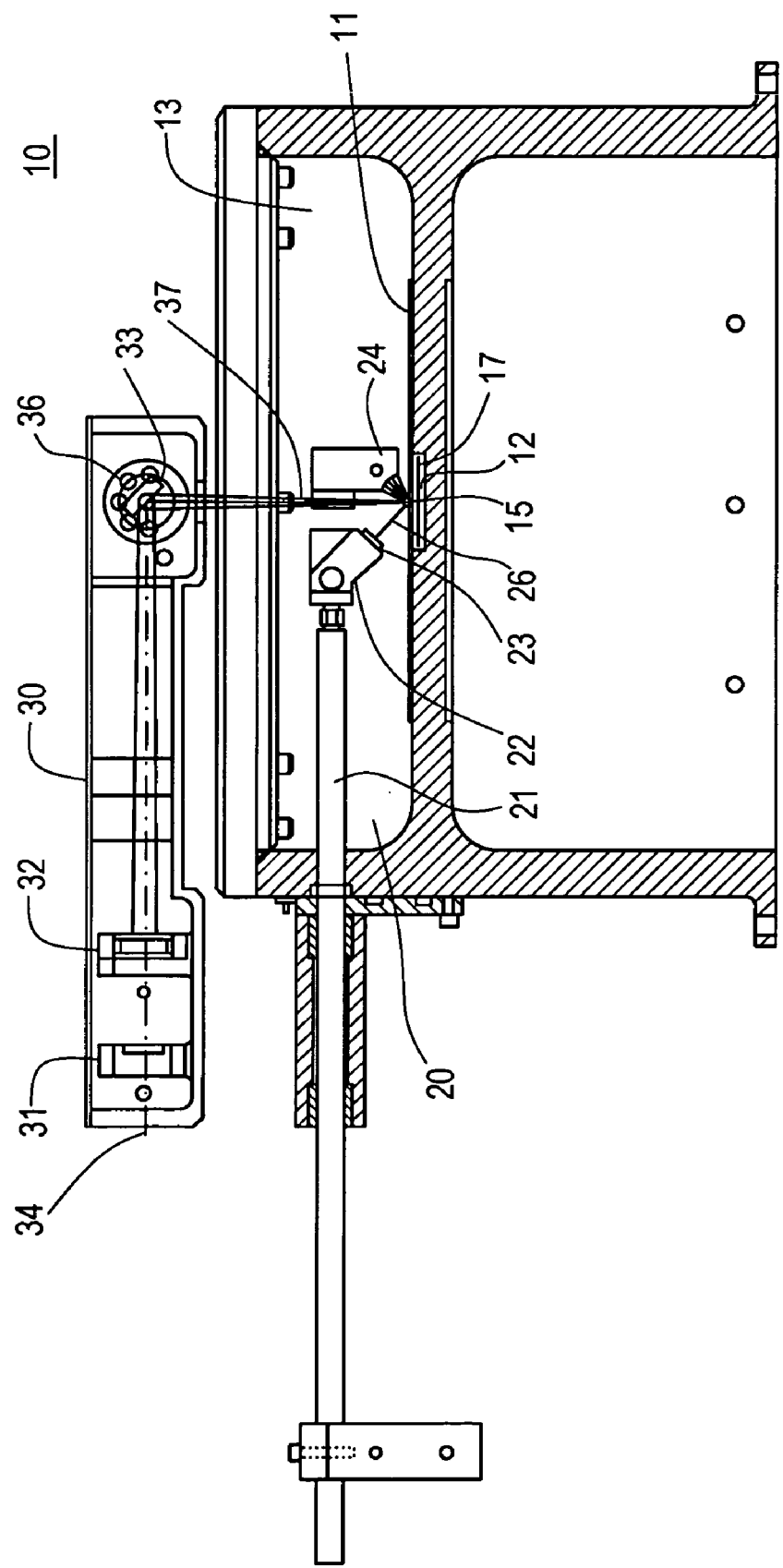
FIG. 2 is a side view of the scanning plasma reactor.
Figure 3:
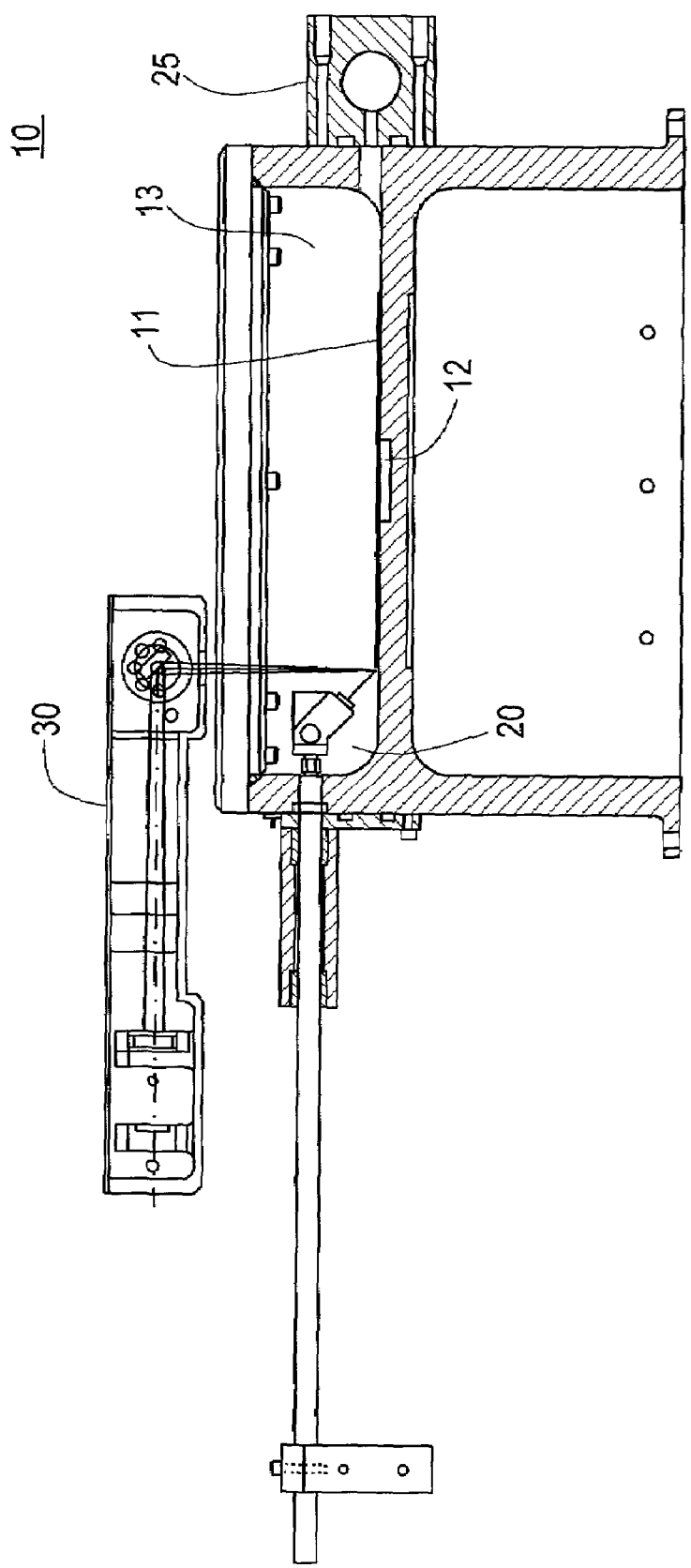
FIGS. 3, 4 & 5 are a sequence of side views showing the scanning plasma reactor at the beginning (FIG. 3) of a cycle, in the middle (FIG. 4) of a cycle, and at the end (FIG. 5) of a cycle.
Figure 4:
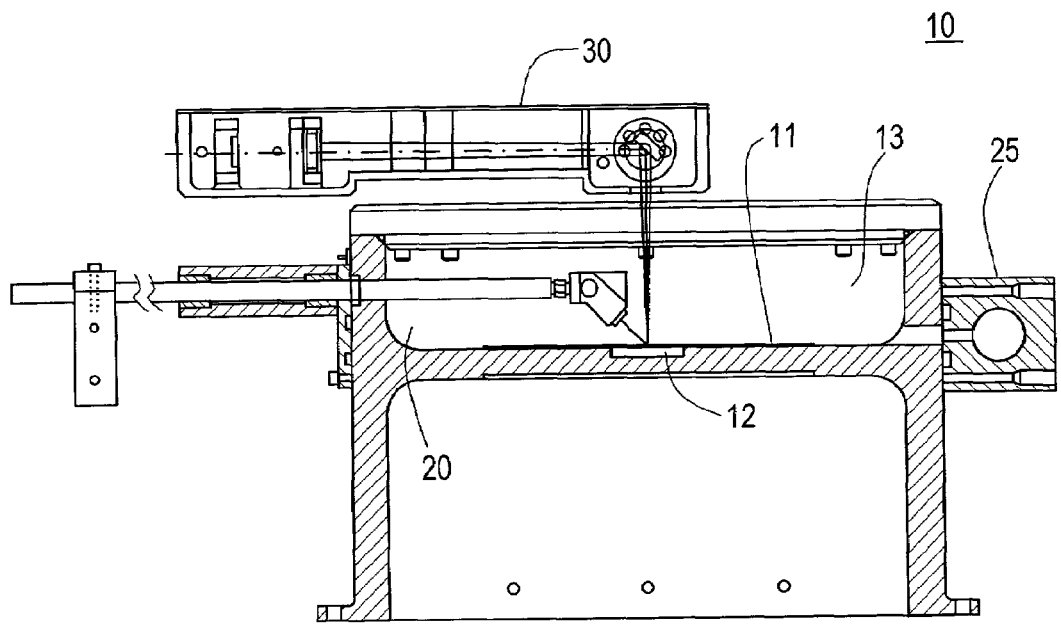
Figure 5:
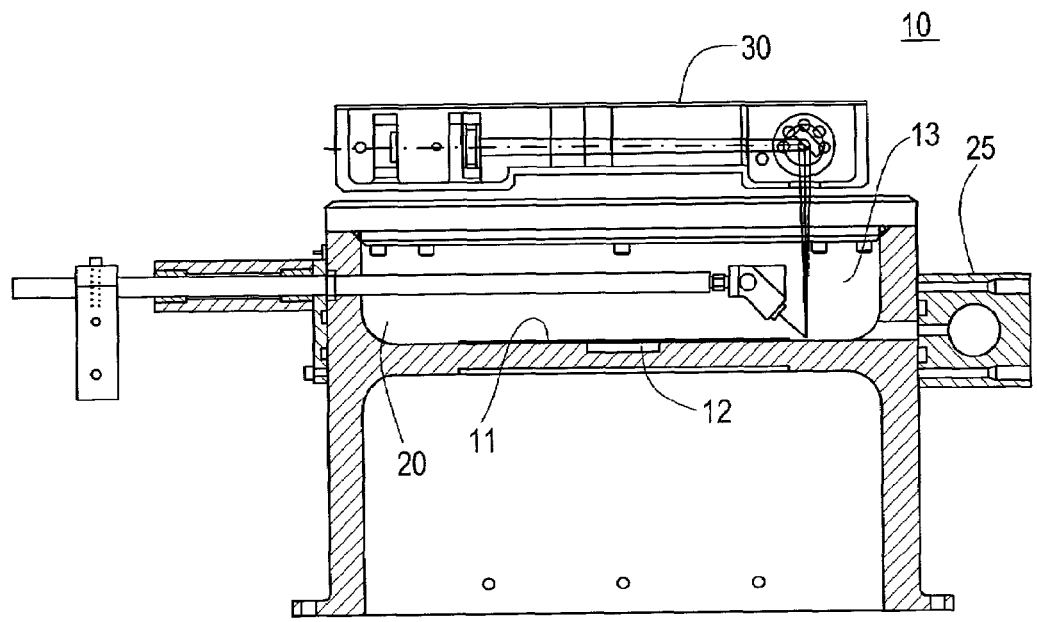
Figure 6:
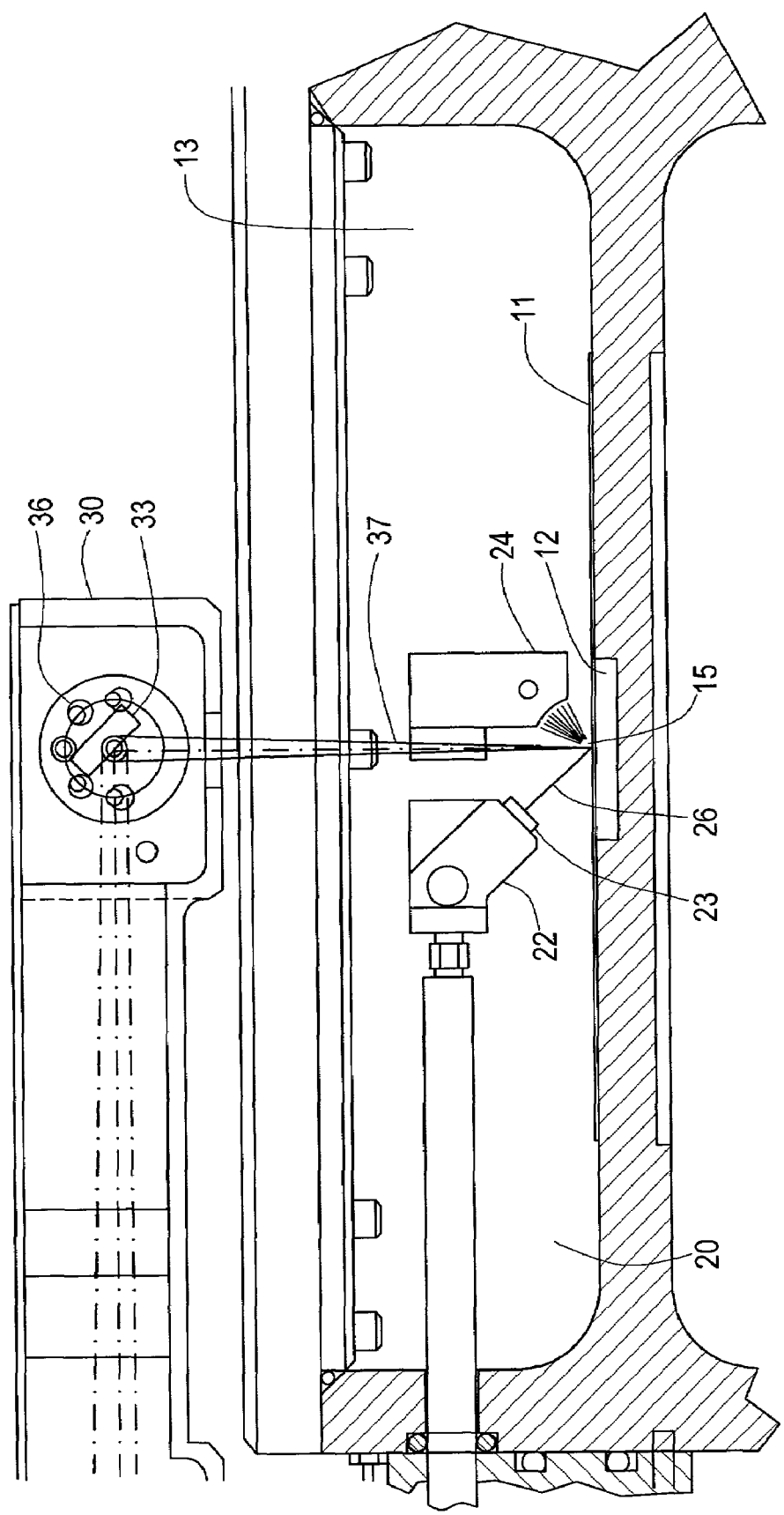
FIG. 6 is a close up side view of the gas injector/exhaust nozzle system showing the proximity to the substrate surface.

In order to achieve still higher fluences or UV intensities in the UV blade of the scanning plasma reactor, a simple change of one of the optical elements, namely 32 of FIG. 2, may be made to change the dimensions of the blade from 200 mm by 0.5 mm to 200 mm by 0.25 mm. This roughly doubles the fluence in the blade, so that the mid-range UV laser of pulse energy of about 300 mJ will deliver a wafer plane fluence of about 60 mJ/cm$^2$. Using the 600 mJ pulse laser, the wafer plane fluence would me about 120 mJ/cm$^2$.

To further increase the UV energy density or fluence in the blade, another optical element substitution may be made to further reduce the dimensions of the blade to 200 mm by 0.12 mm, a highly focused blade. Using the same lasers as discussed above, the fluence at the wafer plane is roughly doubled again compared to that of the 200 mm by 0.25 mm blade and quadrupled compared to that of the 200 mm by 0.5 mm blade. Further increases in fluence at the wafer plane may be achieved by using still larger lasers, which are commercially available. However, almost all of the typical reactions required for IC manufacturing can be driven at energy levels provided by the above examples, as will be disclosed in the specific examples following.

Figure 7:
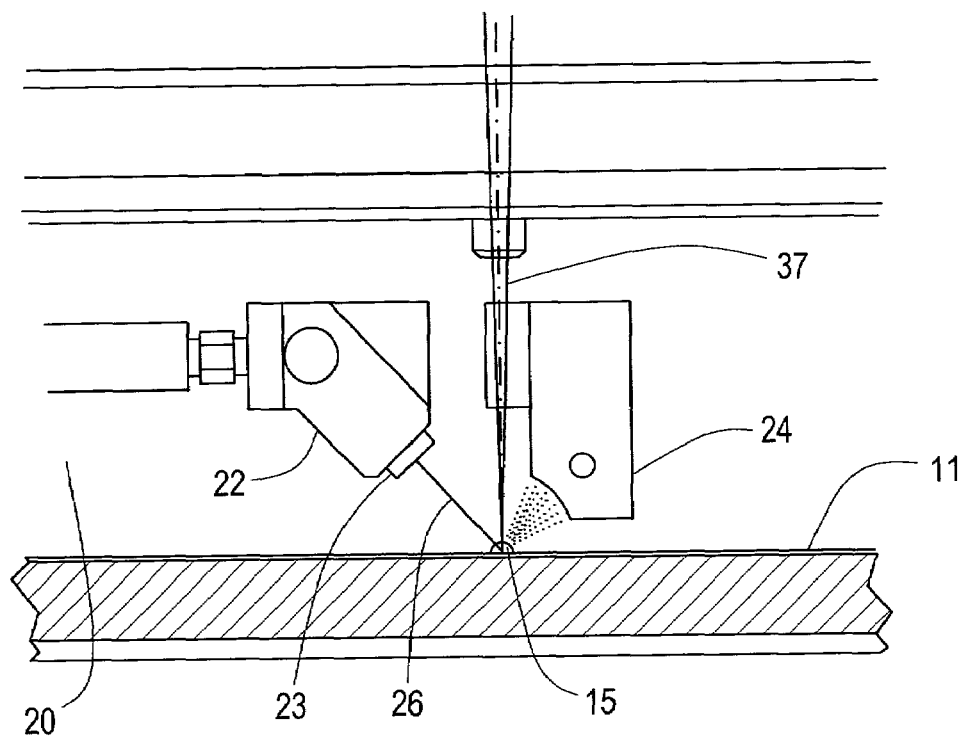
FIG. 7 is a close up side view of the gas injector/exhaust nozzle system showing the gas reaction zone on the substrate surface.
Figure 8:
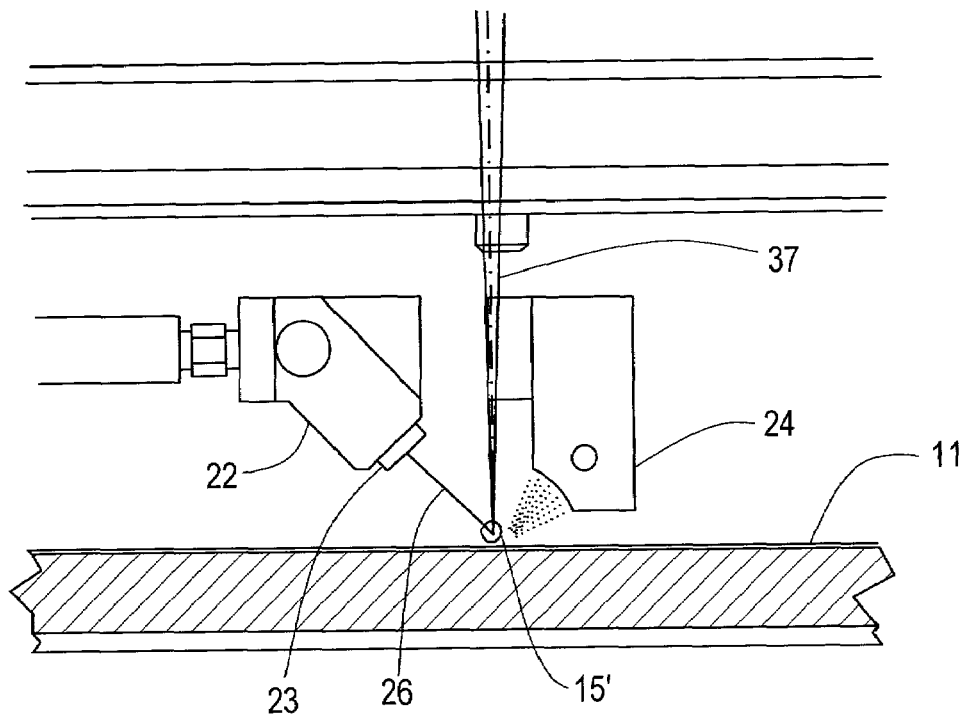
FIG. 8 is a close up side view of the gas injector/exhaust nozzle system showing the gas reaction zone slightly above the substrate surface.

The scanning plasma reactor has the flexibility to generate the gas reaction zone at or above the wafer surface. Generating a reaction zone at the wafer surface has the advantage of producing a maximum energy condition but also increases the possibility of damage to the wafer. Generating the reaction zone slightly above the wafer surface minimizes the potential damage to the wafer but may reduce reaction rates. It is, therefore, desirable to controllably move the reaction zone, as shown in FIGS. 7 and 8. In FIG. 7, gas reaction zone 15 is at the surface of wafer 11. In FIG. 8, gas reaction zone 15' is above the surface of wafer 11.

Figure 9:
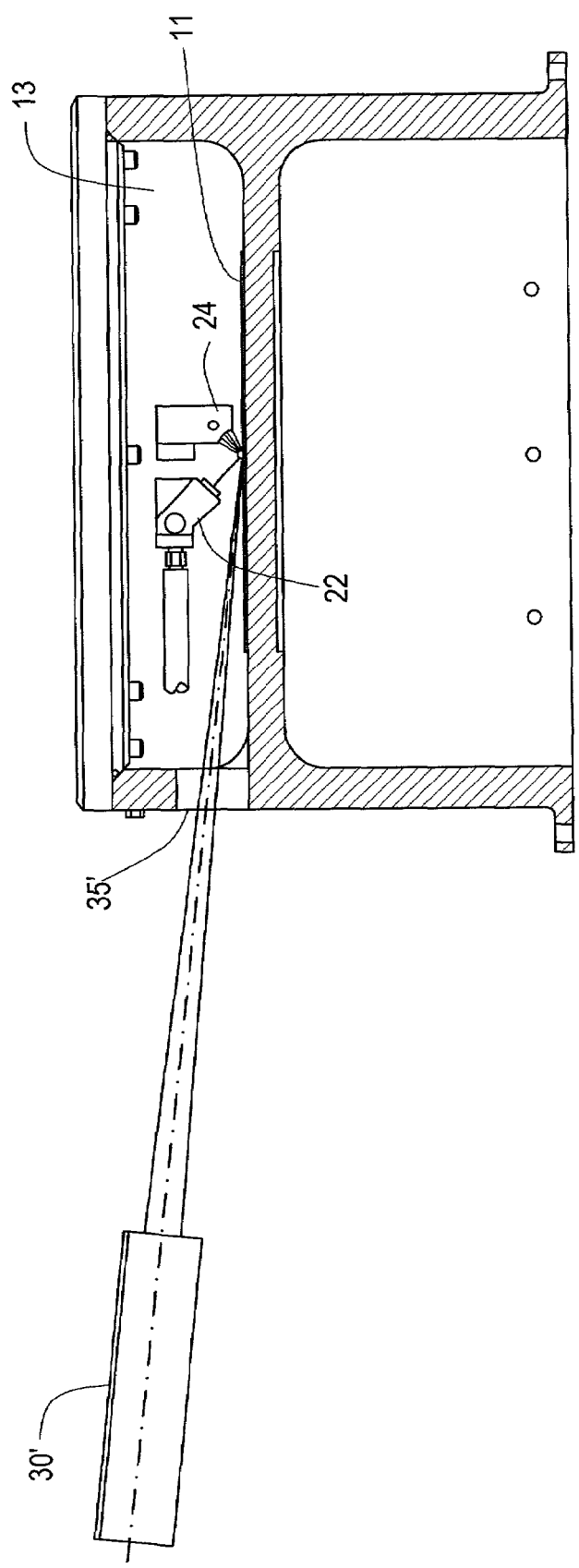
FIG. 9 is a side view of another embodiment of the present invention showing the UV beam being injected from the side of the chamber.
Figure 10:
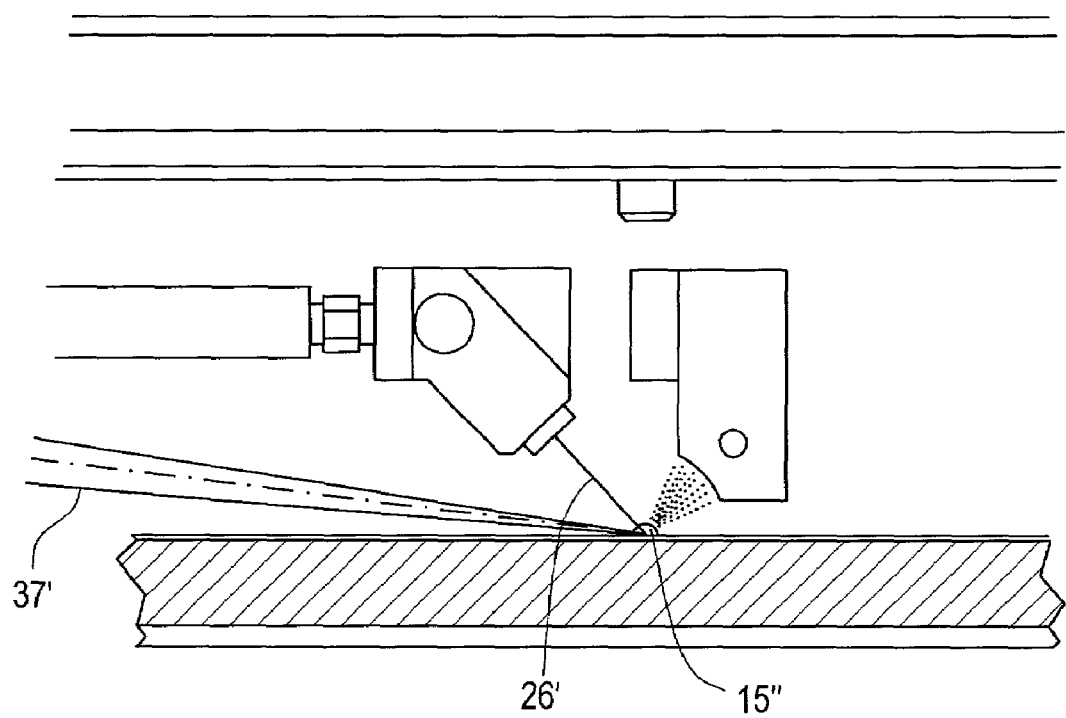
FIG. 10 is a close-up side view of the present invention as shown in FIG. 9.

It may also be desirable to introduce the UV light into the gas reaction zone nearly parallel to the wafer surface. As shown in FIG. 9, the UV light is introduced through window 35', located at the end of chamber 13. By replacing the relatively larger window 35 (FIG. 1) with window 35', further reduction in the overall size of chamber 13 may be possible. Finally, the UV energy in this embodiment reacts almost entirely with the reactant gas volume, further reducing the possibility of damage to the wafer, as shown in FIG. 10, where focused UV bladed radiation 37' reacts with gas stream 26' to form gas reaction zone 15".

In general, the UV energy density ranges necessary to drive reactions for specific IC fabrication processes are as follows. For etching, the etch rate is determined in part by the laser energy density, and ranges from 5 to 100 mJ/cm$^2$ are used. For example, a 193 nm laser providing a wafer plane fluence of about 90 mJ/cm$^2$ will etch polysilicon at a rate of about 0.15 angstrom/pulse in a mixture of carbonyl diflouride (260 Torr) and helium (500 Torr). The photolysis of fluorine results in volatile fluorides and provides selective removal over silicon dioxide, which etches very slowly under these conditions. Also, the etch depth increases linearly with exposure time. The laser reprate for this test was 100 Hz.

To etch silicon dioxide, the same 193 nm laser is operated at about 10 mJ/cm$^2$, and gases such as $NF_3$ and $CF_4/H_2$ are used, resulting in selective removal of silicon dioxide over silicon. The laser reprate for this test was 80 Hz, with etch rates of about 0.12 to 0.07 nm/second at atmospheric pressure.

A blade of infrared energy from a laser source may be injected onto the substrate to serve a number of practical purposes in the scanning plasma reactor. The infrared blade, landing in front of the UV blade, may be used to pre-heat the wafer just before the UV blade is injected. This will increase reaction rates and system productivity.

The infrared blade may also be used to anneal out stresses in the substrate, either in films on the surface or below the surface layer. The third use of the infrared blade may be to provide heat directly into the gas reaction zone (GRZ). This will increase the temperature of the gas reaction zone, which will keep reaction products and by-products in a volatile state longer, enabling easy exhaust of volatile by-products and elimination of any solid debris that could potentially re-deposit on the substrate or in the chamber.

Figure 11:
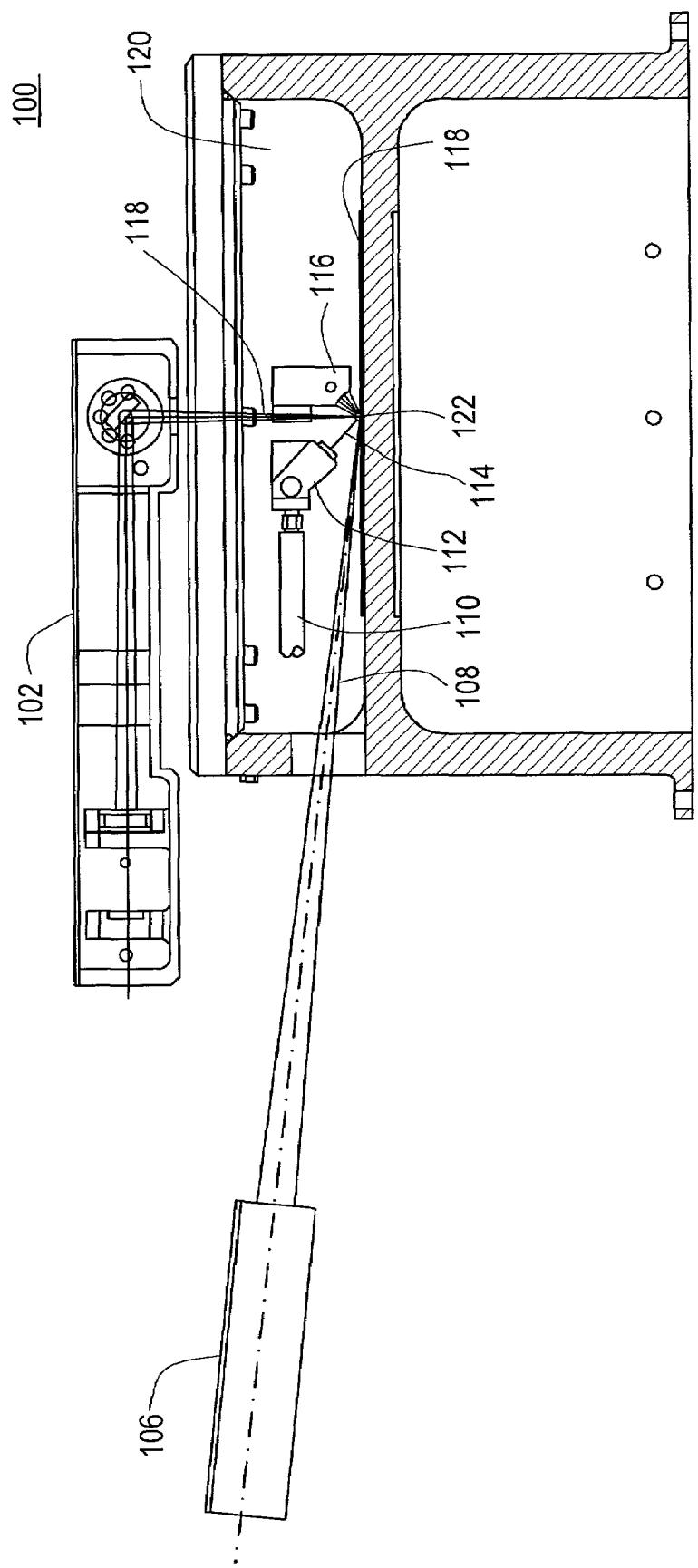
FIG. 11 is a side view of another embodiment of the present invention showing two radiation sources.
Figure 12:
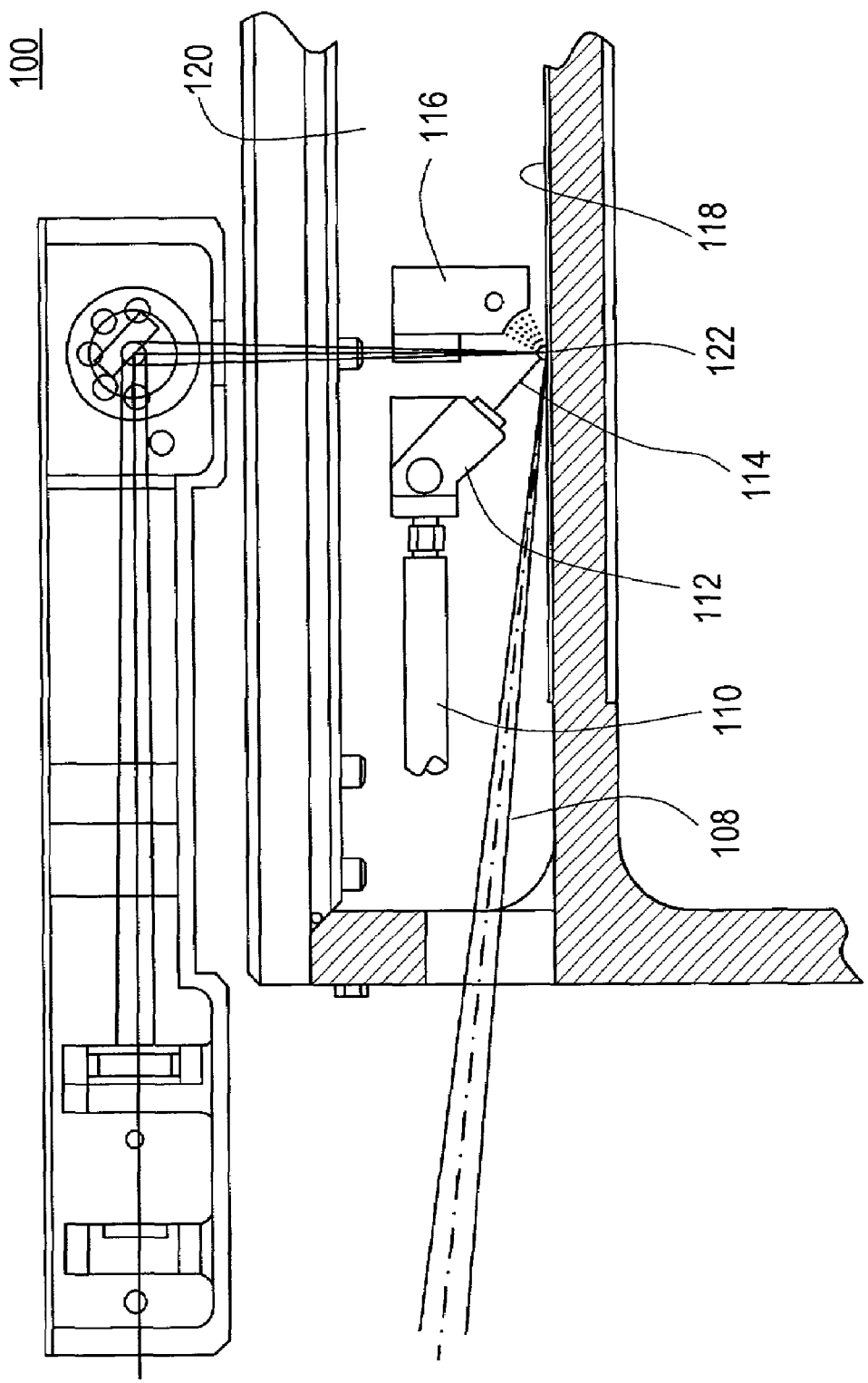
FIG. 12 is a close up view of the embodiment shown in FIG. 11.

As shown in FIGS. 11 and 12, scanning plasma reactor 100 includes beam forming module 102 which forms IR beam 104 and beam forming module 106 which forms UV beam 108. Gas injection module 110 supplies gas stream 114 through nozzle 112. Gas reaction zone 122 is formed inside reaction chamber 120, at or near the surface of wafer 118. Gas exhaust module 116 removes reaction by-products and unreacted reactant gases from chamber 120. While this example shows the IR beam entering from the top of chamber 120 and the UV beam entering from the side of chamber 120, the two beams could be reversed in position or both beams could enter chamber 120 from the same position, i.e., the top or side of chamber 120.

The following examples illustrate applications for the scanning plasma reactor in IC manufacturing. Each application would benefit from the advantage of having a reactor that delivered a highly controlled, uniform reaction zone, directly at the wafer surface, to perform a specific function.

EXAMPLE #1

Copper Surface Modification

The UV irradiation of metallic copper will lead primarily to thermal heating for pulse durations on the nanosecond timescale, like those from an excimer laser. When copper films are placed over silicon dioxide, there is very poor thermal transfer to the silicon. This is partly because of the difference in atomic mass between copper and silicon and because there is effectively an interfacial layer at the junction of the two films. When thin copper films are therefore exposed with the scanning plasma reactor, about 68% of the UV radiation is retained within the copper layer, and the balance is reflected. Copper reflects ~33% of 193 nm radiation; at 157 nm UV laser wavelengths, only 21% is reflected, e.g. more efficient heating. This would result in a temperature rise at the surface to 580° C., or sufficient heat to cause dramatic surface re-arrangement. This is useful in changing the grain structure of the metallic copper layer to enhance conductivity and other physical properties, such as stress relief, in IC chip applications. In an oxygen ambient, an oxide can be simultaneously grown, and in a hydrogen ambient, oxygen can be scavenged or removed as an impurity from the copper. Also, a thin, native copper oxide can be easily removed prior to a deposition step.

The scanning plasma reactor of the present invention was used to modify a thin layer of copper on a silicon wafer. The copper layer was approximately 100 nm in thickness. The UV wavelength was 193 nm. The wafer temperature was set at 50° C. with a heated wafer chuck. The reactant gases used were nitrogen and oxygen. The gas flow into the reaction chamber was 1 SLM, and the gas flow out of the reaction chamber was 1.5 SLM. The chamber pressure was 750 Torr, and the laser pulse energy was 250 mJ. The excimer laser was set to a reprate of 100 Hz and a high voltage of 22 kV.

The wafer was first exposed to the UV energy without moving the scanning optics module. The wafer was thus exposed for a time of less than 1 second to several seconds. The copper film was noticeably melted from these exposures. The wafer was then processed with the scanning optics module and gas delivery module moving across the wafer surface at a rate of about 1 mm/second. This also noticeably re-arranged the physical structure of the copper film. When oxygen was used, an oxide layer was formed on the surface of the copper film. When nitrogen was used, the copper film was physically changed but no copper oxide was formed on the surface.

Another test was run wherein the copper surface was lightly scratched prior to exposure to the UV light. In this test, it was observed that the thin edges of the scratched areas were visibly melted.

These tests suggest that sufficient heat is generated in the UV exposure of thin copper films with either inert or reactive gas, that the copper film, and possibly other metallic films, may be surface modified such that the physical structure is changed. Annealing, re-crystallization, melting and other desired physical changes in copper and other films may be accomplished with the scanning plasma reactor. This experiment also demonstrated that the scanning plasma reactor may be useful in growing thin films using UV light and reactive gas.

This same experiment was performed at 248 nm, and there was no effect noticed on the surface of the copper film. This shows the wavelength dependence of the UV/gas reactions.

As described above, UV radiation at fluences of 30 mJ/cm2 with 17 nanosecond excimer laser pulse durations will heat copper 'seed' layers which are ~100 nm thick to annealing temperatures, and with increased doses, to melting temperatures.

The 'seed layer' is applied by electroless copper plating, and is used as a base for building up added copper thickness by electroplating. Annealing the seed layer with the scanning plasma reactor will permit increases in the electrical conductivity of the copper film, and would also enhance the uniformity and growth rate of the thicker electroplated layer.

Controllably heating the copper seed layer with the UV pulse is also important because one usually has a 'barrier layer' beneath the seed layer that is made of a material such as tungsten. The barrier layer is critical because it must prevent direct contact of the copper to the underlying silicon, yet enable suitable electrical contact. Damage of the barrier layer by excessive heating cannot be allowed. Therefore, the controlled heating of the seed layer can be critical and is readily performed by pulsed UV irradiation. This pulsed UV laser annealing process should be carried out in a reducing atmosphere such as hydrogen or a hydrogen/nitrogen mixture. This may actually reduce the oxygen content of the copper seed layer and enhance its purity and conductivity, but at a minimum it will maintain the high chemical purity of the seed layer, which is very important for the IC device electrical characteristics.

A test was run to determine the physical change of a copper layer as a function of UV dose. The copper seed layer on silicon was scanned with increasing doses at a fixed intensity of ~280 mJ/pulse and a fluence of 28 mJ/cm². Both oxygen and nitrogen gas was used, and this did not seem to change the physical re-arrangement of the copper surface. The test run with oxygen did leave a visible oxide, while the one with nitrogen did not.

The control area had an RMS roughness of 1.103 nm and $R_{max}$ of 16.21. The first scan at 1 mm/second produced an RMS roughness of 2.068 and an $R_{max}$ of 21.15. The second test, using 2 passes with the same conditions, produced an RMS roughness of 3.317 and an $R_{max}$ of 50.801. The conclusion was that the UV energy may be used to physically alter the structure of a metal film by exposure to UV energy with the scanning plasma reactor.

EXAMPLE #2

Growth of Shallow Junction Layers

The creation of a shallow but highly doped region of silicon is a common but critical step in the creation of modern IC chips. Control of the doping density and depth of the shallow junction is currently controlled by ion implantation followed by annealing for high quality circuits. The problem with ion implantation is that it generates significant and damaging heat to the bulk of the wafer, thereby requiring a separate annealing step to 'anneal out' the damage. It also converts photoresist layers which are typically present into disordered graphite, which can then only be removed by using a two step process: a microwave low temperature ashing to burn off the majority of the organic film, followed by a chemical step in a highly corrosive mixture of boiling sulfuric acid and hydrogen peroxide.

The scanning plasma reactor can be used to replace this process by simply depositing a thin layer of doped amorphous silicon on the surface of the silicon wafer, and then transform it into crystalline silicon with the pulsed UV bladed radiation of the reactor.

Since the amorphous silicon can be deposited very uniformly using methods developed for making amorphous silicon solar cells, its thickness and properties can be very highly controlled. Introduction of a dopant such as boron or phosphorus may be done at low or ambient temperatures.

Calculations based on the optical properties of amorphous silicon and crystalline silicon (see FIG. 1 and 2) show that the absorption depth (inverse of the absorption coefficient) of both is short in the UV. It also shows that the reflectivity of the amorphous silicon is generally lower, so that more energy is preferentially absorbed by the amorphous layer. Since the amorphous silicon also has a much lower thermal conductivity, the absorbed pulse energy will be readily retained within it and its temperature can easily reach the temperature for conversion to crystalline silicon. Because the layer is in direct contact with the crystalline silicon surface, this would enable the growth of a high quality crystalline layer. This process is the equivalent of epitaxial layer growth.

Laser light at 193 nm and 248 nm wavelengths, directed through a gas mixture, and impinging on a wafer surface will result in deposition rates of ~7 nm/second. The substrate temperature is in the range of 650-900° C., and epitaxy occurs largely by thermal mechanisms; the UV energy enhances the deposition rate and resulting film quality.

Additional advantages of UV/gas epitaxial film growth are that a highly uniform and very controllably doped silicon layer is created without significant thermal stress being applied to the remaining layers or materials on the wafer, and the process would involve much simpler and lower cost equipment than ion implantation equipment.

EXAMPLE #3

Densification

Deposited thin layers may have microscopic voids that are undesirable and could detract from good performance. For example, the tungsten barrier layer that is used in copper-metalized IC chips needs to be free of cracks and voids. Rapid heating of this metal layer with a UV pulse could improve film quality and reduce defects by providing instantaneous heat and expansion at the film surface sufficient to close the microscopic voids, and thereby densify the layer.

EXAMPLE #4

Adhesion Promotion

It is important for deposited layers to maintain excellent electrical contact with underlying layers for performance and reliability. Rapid heating of a layer, either on the surface or a layer below the top surface, with a UV pulse can be used to anneal out stresses and increase bonding by driving out residual moisture between dissimilar materials.

EXAMPLE #5

Surface Oxide Removal

The removal of surface oxides, such as native oxides, prior to the deposition of new layers on IC wafers is a critical step in all manufacturing processes, usually done by running a multi-step process involving hydrofluoric acid, water rinses, alcohol rinses, nitrogen dry steps, all in a large and expensive 'wet' bench. This process requires significant wafer handling which adds defects to devices. A simpler way is to use the scanning plasma reactor; pulsed UV irradiation in a reducing atmosphere will accomplish this more rapidly, at lower cost, with one step and with a dry process that can be immediately followed by deposition in the same reactor chamber. The reaction is:

$$SiO_2 + NF_3 + H_2 \rightarrow SiF_4 + NO_2 + N_2O + HF$$

The scanning plasma reactor allows multi-process-step integration, so the wafer handling is greatly reduced.

EXAMPLE #6

Silicon Dioxide Deposition

A major step in the fabrication of IC devices is deposition of silicon dioxide, typically done in complex reactors with high temperature and pressure. UV pulsed irradiation from the scanning plasma reactor can be used to dissociate $SiH_4$ and $O_2$ molecules into radical atoms and molecules by the mechanism of multiphoton absorption. At 248 nm laser power levels of 3 mW ($4 \times 10^{16}$ photons) and 100 Hz repetition rate, the dissociated radicals reach the silicon wafer surface and react with adsorbed $O_2$ and oxygen species on the Si surface, forming $SiO_2$. The following are typical test conditions for deposition: substrate temperature of 175° C.; laser wavelength of 248 nm; laser power in the range of 0.5-1.8 Watts; laser repetition rate of 100 Hz; 20 Torr pressure; $O_2/SiH_4$ gas ratio of 6:1. The reaction will work over a fairly wide range of $O_2/SiH_4$ gas ratios, but ratios in the 7-20:1 range provide highest deposition rates. The minimum substrate temperature for rapid deposition ~150° C. The deposition reaction occurs minimally at 100 Torr with a $SiH_4$ gas flow rate of 30 sccm. Typical deposition rates are 200-300 angstroms/minute.

EXAMPLE #7

Deep UV Curing/Resist Stabilization

The scanning plasma reactor may be used in deep UV curing applications, where the surface of a photoresist layer is treated to a specific flux of UV photons, producing a cross-linking reaction that hardens the coating for subsequent processing, such as etching.

In practice, the photoresist coated wafer is processed through the reactor as it would be for any other application. The UV energy is set to a fluence in the range of about 20-75 mJ/cm$^2$, depending on the specific photoresist that is being cured. Since this is primarily a UV polymerization reaction, the gas used may be an inert gas such as argon or nitrogen. The gas that is selected may be determined by the specific photoresist used.

Other embodiments are within the scope of the claims. For example, the UV radiation can be injected over a range of incident angles in order to create special effects or to cause reactions to occur inside the intricate topography of the semiconductor wafer or other topographically structured surface.

What is claimed is:

1. A scanning plasma reactor for exciting or ionizing reactant gases with UV radiation at a stationary substrate surface comprising:
   a beam forming module to transform a UV radiation source raw output into a rectangular beam;
   a gas injection module to deliver at least one reactant gas to the substrate surface;
   a reaction chamber with a UV window through which said beam forming module projects said rectangular beam;
   a vacuum chuck for holding the substrate; and
   a gas exhaust module inside the reaction space defined within said chamber to remove reaction by-products and unreacted reactant gas from the substrate surface,
   wherein said gas injection module and said gas exhaust module are in close proximity to said rectangular beam, and wherein said rectangular beam, said gas injection module and said gas exhaust module are movable across the stationary substrate surface.

2. The scanning plasma reactor of claim 1 wherein said UV radiation source raw output is in the wavelength range of 351 nm to 157 nm.

3. The scanning plasma reactor of claim 1 wherein said rectangular beam has dimensions of approximately 200-300 mm in length and 0.1-10 mm in width.

4. The scanning plasma reactor of claim 1 wherein said rectangular beam has an energy level at the substrate surface in the range of about 0.1-10 Joules/cm$^2$.

5. The scanning plasma reactor of claim 1 wherein said beam forming module consists of a plurality of optical elements.

6. The scanning plasma reactor of claim 5 wherein said beam forming module comprises at least two cylindrical refractive elements.

7. The scanning plasma reactor of claim 1 wherein the reactant gases are reacted to create an etching reaction on the substrate surface.

8. The scanning plasma reactor of claim 1 wherein the reactant gases are reacted to create a deposition reaction on the substrate surface.

9. The scanning plasma reactor of claim 1 wherein the reactant gases are reacted to create an oxidation reaction on the substrate surface.

10. The scanning plasma reactor of claim 1 wherein the reactant gases are reacted to create a reduction reaction on the substrate surface.

11. The scanning plasma reactor of claim 1 wherein the reactant gases are reacted to create a melting reaction on the substrate surface.

12. The scanning plasma reactor of claim 1 wherein the reactant gases are reacted to modify the surface of a metallic or non-metallic film on the substrate surface.

13. The scanning plasma reactor of claim 1 wherein the reactant gases are combined with the UV radiation to cause a polymerization or UV curing reaction on the substrate surface.

14. The scanning plasma reactor of claim 1, wherein said gas exhaust module comprises a block shaped manifold mounted at one end of the chamber to draws gas across the entire width of the chamber.

15. The scanning plasma reactor of claim 1, wherein the substrate surface is moved.

16. The scanning plasma reactor of claim 1 wherein said rectangular beam is focused above the substrate surface to allow interaction with the reactant gas but prevent direct contact between said beam and the substrate surface.

17. The scanning plasma reactor of claim 1 wherein said gas injection module and said gas exhaust module are combined into a gas injection/exhaust system.

18. The scanning plasma reactor of claim 1 wherein said UV window is located on the top of the reaction chamber.

19. The scanning plasma reactor of claim 1 further comprising an electronic control module to progranimably select a reactant gas chemistry and an excitation energy level for one or more processes selected from etching, deposition, doping, ion implantation, re-crystallization, UV curing, oxidation, surface roughening, photochemical modification, and reduction reactions.

20. The scanning plasma reactor of claim 1 wherein the substrate surface is transparent to said rectangular beam and said rectangular beam causes a reaction at a layer of the substrate below the substrate surface.

21. The scanning plasma reactor of claim 1 wherein the reactant gases are reacted to create a doping reaction on the substrate surface.

22. The scanning plasma reactor of claim 1 wherein said vacuum chuck includes a heating element to heat the substrate.

23. The scanning plasma reactor of claim 1 wherein said beam forming module includes a mirror which is adjustably positionable to change the angle of said rectangular beam relative to the substrate surface.

24. A scanning plasma reactor for exciting or ionizing reactant gases with UV radiation at a stationary substrate surface comprising:
   a beam forming module to transform a UV radiation source raw output into a rectangular beam;
   a gas injection module to deliver at least one reactant gas and at least a second fluid or vapor to the substrate surface;
   a reaction chamber with a UV window through which said beam forming module projects said rectangular beam; and
   a gas exhaust module inside the reaction space defined within said chamber to remove reaction by-products and unreacted reactant gas from the substrate surface,
   wherein said rectangular beam and said at least one reactant gas form a reaction zone at or near the substrate surface, said reaction zone being movable relative to the reaction chamber and the substrate by moving said rectangular beam, said gas injection module and said gas exhaust module across the stationary substate surface.

25. A scanning plasma reactor for exciting or ionizing reactant gases with UV radiation at a stationary substrate surface comprising:
   a beam forming module to transform a UV radiation source raw output into a rectangular beam;
   a gas injection module to deliver at least one reactant gas to the substrate surface;

a reaction chamber with a UV window through which said beam forming module projects said rectangular beam; and a gas exhaust module inside the reaction space defined within said chamber to remove reaction by-products and unreacted reactant gas from the substrate surface, wherein said gas injection module and said gas exhaust module are in close proximity to said rectangular beam, and wherein said rectangular beam, said gas injection module and said gas exhaust module are movable inside said chamber across the stationary substrate surface.

26. A scanning plasma reactor for exciting or ionizing reactant gases with UV radiation at a stationary substrate surface comprising:

a beam forming module to transform a UV radiation source raw output into a rectangular beam;

a gas injection module inside the reaction space defined within said chamber to deliver at least one reactant gas to the substrate surface;

a reaction chamber with a UV window through which said beam forming module projects said rectangular beam; and a gas exhaust module said gas exhaust module to remove reaction by-products and unreacted reactant gas from the substrate surface, wherein said gas injection module is in fixed proximity to said rectangular beam and said gas injection module and said rectangular beam are movable across the stationary substrate surface.

27. A scanning plasma reactor for exciting or ionizing reactant gases with UV radiation at a stationary substrate surface comprising:

a beam forming module to transform a UV radiation source raw output into a rectangular beam;

a gas injection module said gas injection module, and said rectangular beam are to deliver at least one reactant gas and at least a second fluid or vapor to the substrate surface;

a reaction chamber with a UV window through which said beam forming module projects said rectangular beam; and a gas exhaust module inside the reaction space defined within said chamber to remove reaction by-products and unreacted reactant gas from the substrate surface, wherein said rectangular beam and said at least one reactant gas form a reaction zone at or near the substrate surface, said reaction zone movable relative to the reaction chamber and the substrate and wherein said gas exhaust module movable across the stationary substrate surface.

28. A scanning plasma reactor for exciting or ionizing reactant gases with UV radiation at a stationary substrate surface comprising:

a beam forming module to transform a UV radiation source raw output into a rectangular beam;

a reaction chamber with a UV window through which said beam forming module projects said rectangular beam;

a gas injection module including a delivery nozzle inside the reaction chamber to deliver at least one reactant gas to the stationary substrate surface;

a linear translation stage connected to both said beam forming module and said gas injection module configured to translate said delivery nozzle and said rectangular beam within said reaction chamber relative to said stationary substrate surface for delivering said reactant gas and said rectangular beam at or near said stationary substrate surface within the reaction chamber; and a gas exhaust module inside the reaction space defined within said reaction chamber to remove reaction by-products and unreacted reactant gas is movable across the stationary substrate surface.

29. A scanning plasma reactor for exciting or ionizing reactant gases with UV radiation at a stationary substrate surface comprising:

a reaction chamber including a UV window;

a beam forming module to transform a UV radiation source raw output into a beam and for projecting the beam through said UV window;

a gas injection module inside the reaction chamber to deliver at least one reactant gas to the stationary substrate surface;

a gas exhaust module inside the reaction space defined within the reaction chamber to remove reaction by-products and unreacted reactant gas from the stationary substrate surface; and means for translating the beam forming module, the gas injection module, and the gas exhaust module together over the stationary substrate surface for delivering the reactant gas and the beam at or near said stationary substrate surface within the reaction chamber.

30. A scanning plasma reactor for exciting or ionizing reactant gases with UV radiation at a stationary substrate surface comprising:

a reaction chamber including a UV window;

a movable beam forming module to transform a UV radiation source raw output into a beam and for projecting the beam through said UV window to a reaction zone;

a movable gas injection module inside the chamber proximate the beam to deliver at least one reactant gas to the stationary substrate surface at the reaction zone; and a movable gas exhaust module inside the reaction space defined within chamber proximate the beam to remove reaction by-products and unreacted gas from the stationary substrate surface at the reaction zone.

* * * * *